(12) United States Patent
Spotti et al.

(10) Patent No.: US 10,164,132 B2
(45) Date of Patent: Dec. 25, 2018

(54) COMPOSITE STATION AND METHOD OF DRILLING AND FIXING FOR THE CONTINUOUS PRODUCTION OF A CONDUCTIVE BACKSHEET WITH AN INTEGRATED ENCAPSULATING AND DIELECTRIC LAYER, FOR PHOTOVOLTAIC PANELS OF THE BACK-CONTACT TYPE

(71) Applicant: VISMUNDA SRL, Venice (IT)

(72) Inventors: Davide Spotti, Trieste (IT); Elisa Baccini, Carbonera (IT)

(73) Assignee: VISMUDA SRL, Padova (IT)

( * ) Notice: Subject to any disclaimer, the term of this patent is extended or adjusted under 35 U.S.C. 154(b) by 316 days.

(21) Appl. No.: 15/036,227

(22) PCT Filed: Nov. 19, 2014

(86) PCT No.: PCT/IB2014/002496
§ 371 (c)(1),
(2) Date: May 12, 2016

(87) PCT Pub. No.: WO2015/075532
PCT Pub. Date: May 28, 2015

(65) Prior Publication Data
US 2016/0293784 A1    Oct. 6, 2016

(30) Foreign Application Priority Data
Nov. 21, 2013 (IT) .............................. TV2013A0194

(51) Int. Cl.
*H01L 31/0224*    (2006.01)
*H01L 31/18*      (2006.01)
(Continued)

(52) U.S. Cl.
CPC .... *H01L 31/022441* (2013.01); *B23K 26/142* (2015.10); *B23K 26/382* (2015.10);
(Continued)

(58) Field of Classification Search
CPC .......... H01L 31/022441; H01L 31/049; H01L 31/18; B23K 26/142; B23K 26/382;
(Continued)

(56) References Cited

U.S. PATENT DOCUMENTS

2010/0242243 A1    9/2010    Kroskey et al.

FOREIGN PATENT DOCUMENTS

| WO | 2009029901 A1 | 3/2009 |
| WO | 2013085387 A2 | 6/2013 |

OTHER PUBLICATIONS

International Search Report for corresponding International Application No. PCT/IB2014/002496.

*Primary Examiner* — Carson Gross
(74) *Attorney, Agent, or Firm* — Egbert Law Offices, PLLC

(57) ABSTRACT

Composite operating station and method of drilling and fixing for the continuous production of conductive backsheets with an integrated encapsulating and dielectric layer, for photovoltaic panels of the back-contact type. The composite operating station is automated and integrates a plurality of working processes carried out simultaneously in a cyclic sequence. In particular, it is based on a multifunction cylindrical roller which by rotating lays out the film of integrated encapsulating and dielectric material, heats it and presses it on the conductive layer of the supporting backsheet for the purpose of the fixing in a correct position, the roller being provided with openings to enable drilling from outside with a laser device and also to enable the forced suction from inside of the fumes and of the residues by means of an exhaust fan.

6 Claims, 2 Drawing Sheets

(51) Int. Cl.
*H01L 31/049* (2014.01)
*B32B 37/00* (2006.01)
*B32B 38/04* (2006.01)
*B23K 26/142* (2014.01)
*B23K 26/382* (2014.01)
*B29C 65/48* (2006.01)
*B32B 37/22* (2006.01)
*B32B 38/00* (2006.01)
*B29L 31/34* (2006.01)

(52) U.S. Cl.
CPC .......... *B29C 65/48* (2013.01); *B32B 37/0053* (2013.01); *B32B 38/04* (2013.01); *H01L 31/049* (2014.12); *H01L 31/18* (2013.01); *B29L 2031/34* (2013.01); *B32B 37/223* (2013.01); *B32B 38/0004* (2013.01); *B32B 2038/047* (2013.01); *B32B 2310/0843* (2013.01); *B32B 2457/12* (2013.01); *Y02E 10/50* (2013.01)

(58) Field of Classification Search
CPC ............ B32B 2457/12; B32B 37/0053; B32B 38/004; B32B 38/0004; B32B 2038/047; Y02E 10/50
USPC ...................................................... 156/272.8
See application file for complete search history.

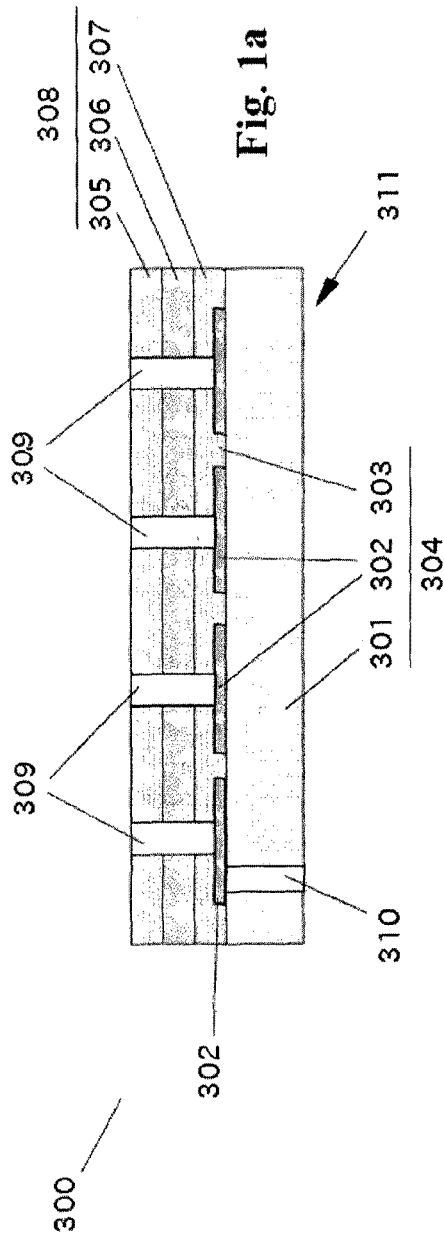
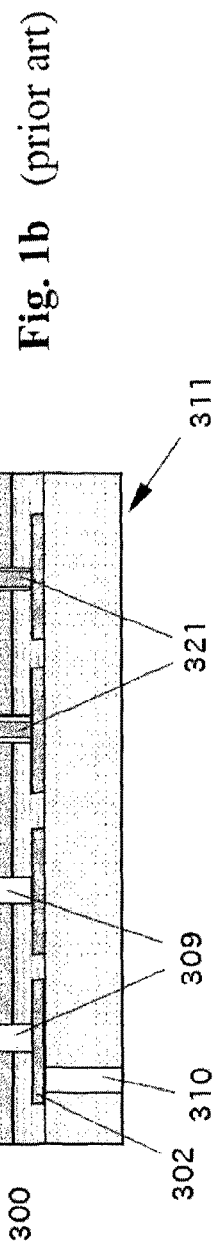
Fig. 1a (prior art)
Fig. 1b (prior art)

COMPOSITE STATION AND METHOD OF DRILLING AND FIXING FOR THE CONTINUOUS PRODUCTION OF A CONDUCTIVE BACKSHEET WITH AN INTEGRATED ENCAPSULATING AND DIELECTRIC LAYER, FOR PHOTOVOLTAIC PANELS OF THE BACK-CONTACT TYPE

The present invention relates to a composite operating station and a method of drilling and fixing for the continuous production of conductive backsheets with an integrated encapsulating and dielectric layer, for photovoltaic panels made with back-contact cells of crystalline silicon.

FIELD OF THE INVENTION

The invention finds particular application in the industrial sector of production of photovoltaic panels, with specific reference to the modern photovoltaic panels with back-contact cells of crystalline silicon, which are also called of second generation to distinguish them from the conventional panels with front-contact and back-contact cells. Said panels with back-contact cells have at the back a multi-layer supporting component which also integrates the electrical contacts and is conventionally called backsheet of the conductive type. The present invention allows to produce in an advantageous way a particular type of conductive backsheet with an integrated encapsulating and dielectric layer.

Nowadays, in principle, one can consider as widely known the advantages provided by the known solutions of photovoltaic panels having cells of the back-contact type; however, said panels are not very widespread yet due to many realization difficulties which are mainly linked to the low availability of systems and of processes suitable for the current production standards, in particular with reference to the required processing precision, to product quality, to the automation of the systems and to industrial costs.

PRIOR ART

For the purpose of determining the prior art related to the proposed solution a conventional check was made, searching public archives, which has led to find some prior art documents, among which:
D1: WO2012015307 (De Jong et al.)
D2: EP2139050 (Bakker et al.)
D3: ITTV2012A000211 (Baccini et al.)
D4: WO2012058053 (Meakin et al.)

D1 proposes a module with back-contact solar cells where electrical conduction is entrusted to a planar element made up of three layers, with the two external conductive layers which are separate by an interposed insulating layer being configured in such a way as to contact in sequence adjacent pairs of cells; the manufacturing process of such a module initially provides to place the cells on a planar surface, the laying of said multi-layer contacting element in such a way as to connect in series a first pair of adjacent cells on the first conductive layer and therefore the series connection to a second pair of cells on the second conductive layer, and so on in sequence to complete the connections, afterwards one provides two further external layers in the form of encapsulating material of the whole package so made which is then supported by a back rigid layer and a front transparent glass.

D2 proposes an assembly process for panels of the back-contact type starting from a conductive backsheet of the conventional type placed with the conductive layer upwards on which the conductive adhesive material is placed and then the lower encapsulating layer is superimposed which is holed, matching the holes with said conductive material; then one lays the cells, the upper encapsulating layer and the glass to be then subjected to the final rolling.

D3 describes a fully automatic process for assembling photovoltaic panels of the back-contact type having an innovative structure, with greater production quality and lower industrial costs, starting from a particular conductive backsheet with an integrated encapsulating and dielectric layer, conventionally called BCBS and made separately to be considered like a purchase component. Said BCBS is made up of a double layer of encapsulating material with interposed dielectric, holed and placed with precision on the conductive sheet to be joined to the supporting backsheet; on said BCBS placed horizontally on a tray with the conductive layer upwards and with the contacting areas of the cells already masked it is therefore possible to lay directly and automatically a conductive material like ECA, with distribution of the type called drop by drop or dispensing, providing an electronic control system for the recognition of position; afterwards one lays the cells, the upper encapsulating layer and the glass, to be then subjected to the final rolling.

D4 proposes the following process for panels of the back-contact type: laying of conductive ribbons on a backsheet on which some adhesive material has been previously applied, such as EVA; laying of dielectric material on the conductive ribbons; laying of conductive material, such as ECA, on the conductive ribbons however without specifying with which positioning logic; laying of cells, upper EVA layer, glass and final rolling. As an alternative, one lays the conductive ribbons on a backsheet on which some adhesive material has been previously applied, for example EVA; laying of dielectric material on the conductive ribbons; laying of conductive material, such as ECA, on the conductive ribbons without specifying with which positioning criterion; laying of a holed EVA layer with the holes in correspondence of where the ECA was laid; laying of cells, upper EVA layer, glass and final rolling.

In conclusion it is reasonable to consider as known:
a photovoltaic panel of second generation with cells of the back-contact type and a supporting backsheet comprising the electrical circuits, on which one then lays in sequence: the layer of dielectric material as an insulating mask, the conductive material, the lower encapsulating layer with centering of the holes on the contacts, the cells, the upper encapsulating layer, the glass;
a particular and advantageous solution of a panel of second generation which comprises a conductive backsheet of the evolved type called BCBS, which integrates the functions of dielectric mask and of lower encapsulating layer;
a system and a process for the automatic assembly of a panel of second generation starting from a conductive backsheet of the BCBS type already made.

DRAWBACKS

In conclusion, we have observed that the known solutions described have some drawbacks or anyway some limits.

Firstly, it has been found that today assembly processes are little automated and include several manual operations, with high probability of errors, reprocessing and waste and as a consequence with a decrease in the quality and reliability and with high industrial and labour costs; this problem is mainly linked to the complex and expensive automation of the systems and of the processes which are arranged according to a specific panel configuration. Furthermore, we found a limit in quality control and in the conventional methods of product inspection during the assembly process, in particular in the case of high production volumes.

Secondly, in the known assembly processes of the panels of the back-contact type, as for example in D2, a particular difficulty was found in the correct positioning of the holed lower encapsulating layer, which is interposed between the BC and the cells, being of the flexible and deformable type and of difficult positioning on said BC, a high degree of accuracy being necessary when the conductive material has been previously applied on the BC in such a way as to match each hole of said encapsulating layer. In fact, it is known that this operation implies a high probability of deformation of said holed encapsulating layer as well as of offsetting of the holes with respect to said BC, being particularly weakened by the holes because of the nature and of the reduced thickness of the material; as a result, a high risk of contamination by the conductive material which makes the contacts is observed, there also being the possibility of a dangerous short-circuit towards the subsequently superimposed cells. Furthermore, we remind that said conductive material is laid previously and is therefore subject to flashes or offsetting due to the following application of the lower encapsulating layer.

Thirdly, it has been found that in the known assembly processes of the panels of the back-contact type, as for example in D3 and with particular reference to the advantageous solution of a conductive backsheet with an integrated encapsulating and dielectric layer, also referred to by the acronym BCBS, automatic systems and processes optimized for its manufacturing are not known. More in general, on the market there is no BC at competitive prices and there is no system which enables, in a convenient and advantageous way in terms of working times and costs, to industrially assemble conductive backsheets for back-contact cells with high quality standards and high production volumes.

Fourthly, it was also observed that the established practice in the known art to apply by silkscreen printing the insulating dielectric mask directly on the metal conductive layer of the BC is a limit in the adoption of conductive backsheets for the construction of panels. This practice, in fact, implies long working times and a high degree of complexity since at least three operating phases are required, that is to say, silkscreen printing, hardening or curing and washing, with low tolerances of the process parameters; to this purpose, moreover, one generally uses dielectric materials which are typically used in the electronics sector which, besides being very expensive, are little durable outside, that is to say, in the normal operating conditions of a photovoltaic panel.

Still with reference to the known assembly processes of panels of the back-contact type, as for example in D1, D2 and D4, it was particularly observed that a high amount of operations and passages is required for the purpose of obtaining a BC comprising the dielectric mask, encapsulating layer and conductive material, since a high degree of accuracy, of repeatability, of control and of reliability is required.

Hence the need for the companies of the sector to find solutions which are more effective with respect to the existing solutions; the aim of the present invention is also to solve the described drawbacks.

SHORT DESCRIPTION OF THE INVENTION

This and other aims are achieved by the present invention according to the characteristics as in the appended claims, solving the arising problems by means of a composite operating station and method of drilling and fixing for the continuous production of conductive backsheets with an integrated encapsulating and dielectric layer, for photovoltaic panels of the back-contact type. Said composite operating station is of the automated type and integrates a plurality of working processes carried out simultaneously in a cyclic sequence; in particular, it is based on a multifunction cylindrical roller which, by rotating, unwinds the film of integrated encapsulating and dielectric material, heats it and presses it on the conductive layer of the supporting backsheet in order to fix it in the correct position, said roller being provided with openings to enable drilling from outside with a laser device and also to enable the forced suction from inside of the fumes and of the residues by means of an exhaust fan.

AIMS

In this way by the considerable creative contribution the effect of which has allowed to reach a considerable technical progress, some aims and advantages are achieved solving the main problems mentioned above.

A first aim of the invention was to enable production in an industrially advantageous way of a conductive backsheet with an integrated encapsulating and dielectric layer of the BOBS type, for photovoltaic panels of the back-contact type, as described above. In particular, the invention proposes a composite and automatic operating station which simultaneously performs in a cyclic sequence the main functions of the continuous production process, that is to say, the drilling of the integrated encapsulating and dielectric layer and the related fixing on the conductive backsheet in the correct position. Said composite operating station allows to obtain said backsheets with low costs, high performances and long life; in particular, the invention improves the repeatability and increases the quality standards of the finished product, as compared to the conventional solutions.

A second aim of the invention was to allow for high production capacity also saving the space occupied by the system and the related investment, being industrially advantageous.

A third aim was to eliminate the faults linked to manual operations.

A fourth aim was to provide flexibility in drilling thanks to the laser system, allowing for possible adjustments in the configuration of the holes to be made on the encapsulating and dielectric multi-layer for the purpose of the following fixing on the conductive backsheet in correspondence of the contacts.

A fifth aim was to allow the elimination of the conventional silkscreen printing which forms an insulating layer on the conductive backsheet, with a significant saving in terms of time and costs. Moreover, it was possible to replace the conventional insulating solutions which today are used in the backsheets of the back-contact type with a more modern and cheaper solution, as described above, with a constant and stable structure and with the combined insulating and encapsulating functions which is more resistant in lime. As an alternative to the multi-layer solution described above, with an integrated encapsulating and dielectric layer, one can also adopt an equivalent single-layer solution which combines the adhesive and encapsulating behaviour with the dielectric insulating function, thanks to a suitably charged film polymer which can be processed in the same way and has equivalent aims.

These and other advantages will appear from the following detailed description of some preferred embodiments, with the aid of the schematic drawings enclosed whose details of execution are not to be considered limitative but only illustrative.

CONTENT OF THE DRAWINGS

FIG. 1a shows, in a schematic sectional view, a conductive backsheet with an integrated encapsulating and dielectric layer, of the type called BCBS, according to the known art as for example in D3.

FIG. 1b shows, in a schematic sectional view, the final composition of the photovoltaic panel comprising said backsheet of the BCBS type, as in FIG. 1a, according to the known art as for example in D3.

DESCRIPTION OF AT LEAST ONE EMBODIMENT OF THE INVENTION

Figure 2:
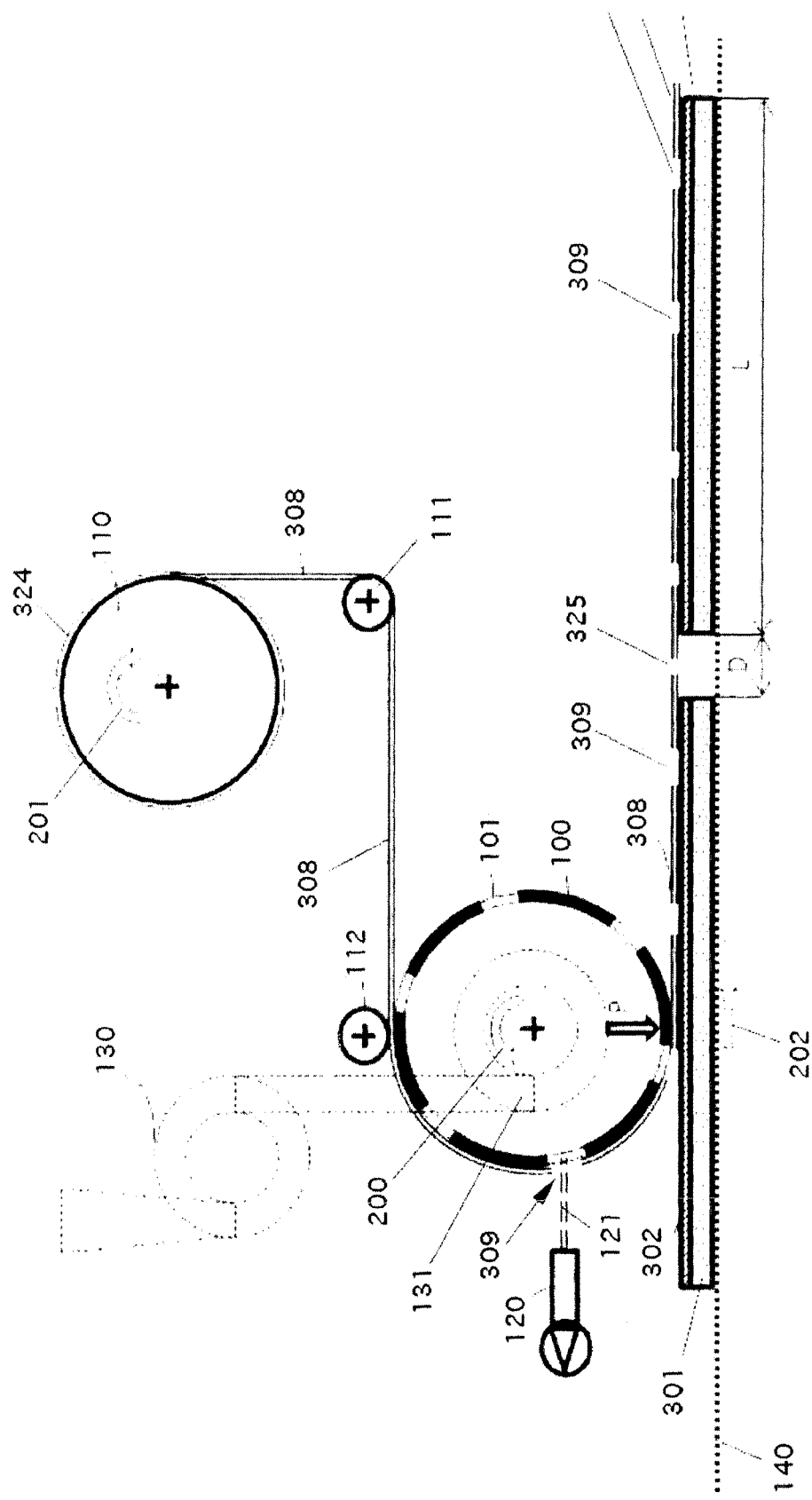
FIG. 2 shows, in a schematic sectional view; the composite operating station of drilling and fixing for the continuous production of conductive backsheets with an integrated encapsulating and dielectric layer, as provided by the present invention.

The present invention describes a composite station and a method intended to concentrate and optimize the production cycle of conductive backsheets with an integrated encapsulating and dielectric layer, for the assembly of photovoltaic panels of the back-contact type. In more detail, there is provided a station (10) of the complex type, it being automated and integrating a plurality of operations carried out in a cyclic sequence for the purpose of making simultaneously, with high repeatability and low costs, a particular type of conductive backsheet (300) with an integrated encapsulating and dielectric layer which is conventionally called BCBS, see prior art table (FIG. 1a); said conductive backsheet being intended for the construction of photovoltaic panels with a back-contact architecture (330), see prior art table (FIG. 1b). It is observed that said conductive backsheet is of the type described in ITTV2012A000211 (Baccini et al.) and in its turn comprises a semi-finished element called Stack (308) which is preferably multi-layer, of the type described in ITVI2012A000133 (Baccini et al.).

Hence, said BCBS conductive backsheet being a semi-finished product having a complex structure, a compact element which integrates a plurality of superimposed layers with diversified specific functions. Said conductive backsheet comprising at least: an insulating dielectric back layer (301) which acts as a support, in its turn normally made up of at least two layers the most external of which remains exposed to air and is therefore treated to be more resistant to hydrolysis and to ultraviolet rays, a metal conductive layer (302) suitably shaped and configured with openings (303) according to the back contacts of the cells' (320) of the back-contact type to be connected in series, a multi-layer element of the composite type which is conventionally called Stack (308) and is holed (309) in correspondence of the back contacts of said cells (320). Said Stack is made up of a first encapsulating or thermoadhesive layer (305) in contact with said BC and of a second encapsulating or thermoadhesive layer (307) in contact with the cells (320) placed on the upper part, between which an internal layer of dielectric material (306) is interposed which acts as a selective insulating mask, see prior art tables (FIGS. 1a-b). In order to enable the electrical contacting with the back junction box, through-holes (310) can be made on said BC (304); furthermore, for the purpose of facilitating said contacting, in correspondence of said holes one can optionally integrate conductive interface elements as is also described, as a non-exhaustive example, in ITTV20130059 (Baccini et al.) or ITTV20130060 (Baccini et al.).

Furthermore, see prior art tables (FIGS. 1a-b), it is observed that the integrated encapsulating and dielectric layers constituting said Stack (308) have the combined functions of lower encapsulating layer (305 and 307) which fills all the interstitial spaces and is welded to the upper encapsulating layer (322), thus providing a complete sealing and protection to the electrical circuit made with said cells (320) against any harmful atmospheric agent such as moisture, condensation or dust; the dielectric layer (306) interposed to the encapsulating layer, on the other hand, has the function of a selective welding mask, that is to say, it prevents any possible short-circuits that may occur during the heating and polymerization of the conductive adhesives and of the encapsulating layers contained in the photovoltaic module during the rolling phase of construction in the furnace. Said BCBS (300), therefore, is particularly advantageous in terms of production simplification, repeatability and time saving in the assembly of a photovoltaic panel of the back-contact type (330).

The assembled structure of a photovoltaic panel with a back-contact architecture (330) comprising said BCBS (300), see prior art tables (FIGS. 1a-b), is therefore simplified with respect to the conventional solutions of a panel being made up, in sequence from the back side (311), of: a conductive backsheet with an integrated encapsulating and dielectric layer, called BOBS (300); the photovoltaic cells of the back-contact type (320); a conductive adhesive, for example of the type called ECA (321); a front encapsulating layer (322); a front glass (323). The back layer (301) supporting said BOBS (300) can in its turn be of the composite type, according to the known art, being made up of various normally polymeric and adhesive layers with diversified functions dedicated to the protection from the atmospheric agents, such as moisture and UV rays. As a non-exhaustive example we recall the embodiment of the multi-layer type consisting of a layer of PET against the UV rays, a barrier to vapour, the supporting BS layer and a primer layer of EVA; moreover, we also recall the embodiment of the metal conductive layer protected by a layer of the anti-corrosive type.

The following terms and acronyms, therefore, hereinafter have the following meanings as specified:

BC: is the acronym for conductive backsheet for cells of the back-contact type, it being a backsheet which integrates the electrical circuits that realize the electrical connection in series of the solar cells placed thereon;

BCBS: is a particular conductive backsheet with an integrated encapsulating and dielectric layer, in the form of a semi-finished composite and multifunction element which industrially simplifies the assembly of the panels with a back-contact architecture, as described above;

Back-contact: one defines as back-contact the photovoltaic cells having the contacts with both positive and negative electrical polarity placed at the back, as a consequence also the panels comprising such cells and a backsheet of the conductive type are defined as back-contact panels;

Stack: a multi-layer semi-finished element, in a film, made up of two encapsulating layers of the EVA type or polyolefins with an interposed dielectric layer, being holed as provided by the invention.

For the purpose of the present invention, as an alternative one can also use an equivalent solution of the single-layer and multifunction type which combines the adhesive and encapsulating behaviour with the dielectric insulating function, for example by means of a film polymer particularly charged to perform such functions.

The provided composite station and method are based on a continuous production logic, of the rotary type, which carries out in a cyclic sequence the main working processes necessary for the formation of said conductive backsheet (300) with an integrated encapsulating and dielectric layer, said working processes being concentrated in one single operating station; in particular, such operations are at least of drilling of the film of said Stack (308) and its fixing onto the BC (304) in such a way that the holes (309) made correspond exactly to the contacting points of the cells on the conductive layer (302), obtaining that the encapsulating material with the interposed dielectric layer also acts as an insulating mask. In more detail (FIG. 2), said composite station (10) is made up of at least:

one coupling means of the rotary type with a multifunction cylindrical roller (100) which by rotating carries out a plurality of working processes in a cyclic sequence: it lays out the film; presses it and heats it for the purpose of the fixing on the BC, also enabling the laser drilling in correspondence of counter-holes and enabling the forced suction of the remaining fumes and of the waste;

drilling means with at least one laser device (120) which pierces the Stack film in correspondence of the through-counter-holes (101) present on the roller (100) and optionally carries out the separation cutting of the film between the backsheets;

combined means (110-2) for the unwinding of the film coil (324), comprising the rotating support (110) of the coil, intermediate rollers (111) and a counter-roller (112) in adherence to the multifunction roller (100);

one forced suction means of the external exhaust fan type (130), also with vacuum, with a portion connected inside the multifunction roller (100);

horizontal movement means with a moving supporting surface (140).

The Stack (308) is continuously unwound from the coil (110, 324) and conveyed by an intermediate roller (111) towards the multifunction roller (100) by means of a counter-roller (112) which forces it to be wound up in adherence around said multifunction roller (100); said roller (100) having at least the following particular characteristics:

it is holed on its cylindrical surface in such a way as to have the same drilling pattern to be made in the Stack itself;

it is heated totally or partially in such a way as to activate the adhesive characteristic of the thermoplastic material contained in the film of the Stack (308) in the path between the engagement point in adherence, in correspondence in the counter-roller (112), to the fixing point (P) on the BC, said path being followed in adherence to said multifunction roller (100);

it is pressing in such a way as to exert pressure on the Stack (308), in the fixing point (P), against the conductive layer (302) of the backsheet (304) which is simultaneously made to pass below on the moving supporting surface (140);

it is coated on the cylindrical surface with a surface treatment (such as teflonig or another treatment with the same function) which does not allow the Stack to adhere to itself;

it is sucked in a forced way on its inside by said exhaust fan (130-1) which extracts and expels the fumes and the drilling residues.

While the Stack (308) rotates wound around said multifunction roller (100) in the path in adherence (112, P) as described above, sideways from the outside a laser drilling device (120) pierces the Stack (308) over its entire width according to the planned drilling pattern (FIG. 2). Each hole (300) in the Stack made by the incident laser beam (121) is in correspondence of a hole (101) present on the cylindrical surface of the multifunction roller (100 in such a way that the fumes generated by the sublimation of the Stack and any possible residues of said drilling operation are sucked into said rotating roller (100) by means of said exhaust fan (130, 131).

Said laser drilling device (120) (FIG. 2) is of the $CO_2$ commercial type with pulses having a frequency in the range of 20 KHz and power in the range of 300-500 W; the beam (121) is oriented by means of mobile optics and the obtainable drilling speeds are in the range of about 30-50 holes/second. A plurality of laser sources can be added in parallel, for the purpose of dividing into several parts the width of the Stack (308) to be drilled on the cylindrical surface of the multifunction roller, and/or in series in a successive sequence, provided that the laser beam hits the Stack in a zone corresponding to the underlying drilling (101) made in the multifunction roller (100), thus obtaining a reduction in the cycle time of the drilling operation. Said laser device (120), once the drilling phase has been completed, can advantageously also carry out the cutting (325) of the Stack (308) to the pre-set size so that the multifunction roller (100) makes the exact size of the holed Stack to match the underlying conductive surface of the BC (304). Said cutting phase will be synchronized with the phase of advancement of the underlying backsheet and a control system, for example of the automatic vision type, will locate the start and the end edge of the backsheet so as to carry out the cutting of the Stack to the size necessary for the correct complete covering of the BC. In the same way the rotation of the multifunction roller (100) occurs synchronously with the movement (140, 202) of the BC (304) in such a way as to have in the fixing point (P) the same speed of advancement of the Stack (308) and of the BC (304).

As regards said cutting of the Stack, it is also observed that there is an excess of material with respect to the underlying BC (304) equal to a distance (D) which separates two consecutive BCs on said movement system (140, 202) (FIG. 2). Said excess, being of limited sizes, does not cause problems to the production cycle and is not an additional industrial cost since, in any case, after the rolling phase it is necessary to trim the excesses and leaks of material off the module from the perimeter of the glass, said operation being conventionally called trimming.

In more detail as regards the sizes of said components, the invention provides that the following relation is respected, wherein N is a natural integer greater than or equal to 1:

Diameter of the multifunction roller (100)=[Length of the BC (L, 304)+distance between $BCs(D)$]/$N*\pi$ The present invention, made as described above, therefore allows to simultaneously carry out in one single composite operating station (10) of the rotary type the main working processes required for the assembly of a conductive backsheet of the BCBS type (300); for the purpose of completing the production cycle of said backsheet, in fact, it is sufficient to arrange upstream of said composite station (10) a loading station of said BCs (304), previously obtained as a purchase component, said station being of the conventional type and aimed at loading the BCs with the conductive layer (302) facing upwards. In said loading station said BCs are for example taken from a pile and placed on a moving supporting surface (140), such as a conveyor belt, with fixed distances (D) from one another; said loading can be carried out automatically, for example with a pneumatic picking hand, or manually. Optionally, after said loading it is also possible to provide the arrangement of conductive inserts intended to facilitate the back connection to the back junction box. Therefore, after the drilling and the fixing of the Stack (308) on the BC (304) as provided by the invention, downstream of said composite station (10) it is sufficient to provide a station of inspection and unloading of the BCBSs so obtained, being for example stacked to facilitate moving or storing.

By the composite operating station (10) and the method described above it is possible to obtain industrially, according to the pre-set aims, a conductive backsheet of the BCBS type (300) with an integrated encapsulating and dielectric layer which is ready to be advantageously used as a starting element for the automatic assembly of photovoltaic panels with a back-contact architecture (330), for example by means of an automatic system and a production process of the type described in ITTV2012A000211 (Baccini et al.).

REFERENCE

(10) composite station of drilling and fixing for the production of conductive backsheets with an integrated encapsulating and dielectric layer,
(100) multifunction cylindrical roller of the rotating, pressing, heating and sucked type,
(101) through-counter-holes, to enable,drilling and suction,
(110) rotating support for the film coil
(111) intermediate roller
(112) counter-roller
(120) laser device,
(121) laser beam,
(130) exhaust fan also with vacuum,
(131) portion of exhaust fan inside the roller,
(140) supporting surface of the backsheets and part of the horizontal movement system,
(200) direction of rotation of the multifunction roller,
(201) direction of rotation for film unwinding,
(202) direction of advancement of the backsheet,
(300) conductive backsheet with an integrated encapsulating and dielectric layer of the type called BCBS,
(301) supporting and protection backsheet,
(302) metal conductive layer,
(303) openings which configure the conductive layer according to the specific circuit which will electrically connect the subsequently superimposed cells,
(304) conductive backsheet,
(305) first encapsulating or thermoadhesive layer,
(306) layer of dielectric material interposed in the encapsulating layer,
(307) second encapsulating or,thermoadhesive layer,
(308) integrated encapsulating and dielectric material in a film,
(309) holes in correspondence of the back contacts of the cells,
(310) through-holes for contacting the back junction box,
(311) back side in shade,
(320) photovoltaic cells of the back-contact type,
(321) cells contacting element,
(322) front encapsulating layer,
(323) glass,
(324) coil of the film of integrated encapsulating and dielectric material,
(325) separation cutting,
(330) photovoltaic panel with a back-contact architecture comprising a conductive backsheet with an integrated encapsulating and dielectric layer being of the type called BCBS,
(D) distance between backsheets,
(L) length of the backsheet,
(N) natural integer greater than or equal to 1,
(P) fixing point by pressure and heating.

The invention claimed is:

1. A composite station of drilling and fixing for continuous production of conductive backsheets having an integrated encapsulating and dielectric layer in which the conductive backsheets are used in photovoltaic panels having a back-contact architecture, the composite station comprising:
a cylindrical roller having an anti-adherent coating on a surface thereof, the cylinder roller adapted to cylindrically carry out an unwinding and laying out a film of the integrated encapsulating and dielectric layer, laser drilling the film so as to form holes, and fixing the film to the conductive backsheet by pressing and heating;
a laser cooperative with said cylindrical roller, the laser adapted to pierce an outside of the film in correspondence to the holes;
an unwinder cooperative said cylindrical roller so as to unwind the film from a coil, said unwinder having a rotating support, intermediate rollers and a counter-roller cooperative with said cylindrical roller;
an external exhaust fan that produces a vacuum, said external exhaust fan having a portion connected inside said cylindrical roller; and
a movable support surface extending horizontally below said cylindrical roller.

2. The composite station of claim 1, said intermediate roller adapted to convey the film from the coil toward the cylindrical roller by way of the counter-roller so as to cause the film to wind around the cylindrical roller, said laser piercing the film over an entire width of the film, said cylindrical roller having holes on a surface thereof, said laser adapted to pierce the film in correspondence to the holes of said cylindrical roller, said external exhaust fan adapted to suck fumes generated from the laser, said cylindrical roller being heated to a temperature that activates an adhesive in the integrated encapsulating and dielectric layer against a conductive layer of the conductive backsheet.

3. The composite station of claim 2, further comprising:
mobile optics cooperative with said laser so as to orient said laser, said laser having a drilling speed of between 30 and 50 holes per second, said laser adapted to cut the film such that the integrated encapsulating and dielectric layer has a size that matches a size of the conductive layer, said laser cutting in synchronization with an advancement of the conductive backsheet on the movable support surface.

4. The composite station of claim 1, further comprising:
a loading station for the conductive backsheet, said loading station cooperative with said movable support surface so as to move the conductive backsheet along a line, said loading station being upstream of said cylindrical roller; and
an inspection and unloading station downstream of said cylindrical roller, said inspection and unloading station adapted to allow an inspection and an unloading of a finished product from said cylindrical roller.

5. A method for continuous production of conductive backsheets with an integrated encapsulating and dielectric layer, the conductive backsheet for use in construction of photovoltaic panels having a back-contact architecture, the method comprising the sequential step of:
   unwinding and laying out a film of the integrated encapsulating and dielectric layer;
   drilling the film to form holes; and
   fixing the film onto a conductive layer of the conductive backsheet such that the holes correspond to the electrical contacting points of an insulting mask, the steps of unwinding, drilling and fixing being carried out simultaneously by rotation of a cylindrical roller.

6. The method of claim 5, further comprising:
pressing the film with the cylindrical roller;
heating the film by the cylindrical roller during the step of pressing; and
sucking fumes away from the film as the holes are being drilled.

* * * * *